(12) United States Patent
Moon et al.

(10) Patent No.: US 9,336,842 B2
(45) Date of Patent: May 10, 2016

(54) ADDRESS COUNTING CIRCUIT AND SEMICONDUCTOR APPARATUS USING THE SAME

(71) Applicant: SK hynix Inc., Icheon-si Gyeonggi-do (KR)

(72) Inventors: Young Suk Moon, Icheon-si (KR); Hyung Dong Lee, Icheon-si (KR); Yong Kee Kwon, Icheon-si (KR); Hyung Gyun Yang, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 210 days.

(21) Appl. No.: 13/845,293

(22) Filed: Mar. 18, 2013

(65) Prior Publication Data
US 2014/0177358 A1 Jun. 26, 2014

(30) Foreign Application Priority Data
Dec. 24, 2012 (KR) .................. 10-2012-0151737

(51) Int. Cl.
*G11C 8/00* (2006.01)
*G11C 8/04* (2006.01)
*G11C 7/10* (2006.01)

(52) U.S. Cl.
CPC ............. *G11C 8/04* (2013.01); *G11C 7/1006* (2013.01); *G11C 7/109* (2013.01)

(58) Field of Classification Search
CPC .......................................................... G11C 8/04
USPC ........................................ 365/230.01, 230.08
See application file for complete search history.

(56) References Cited

U.S. PATENT DOCUMENTS

| 3,704,454 | A | * | 11/1972 | McCoy et al. | ............ 365/230.06 |
| 4,190,897 | A | * | 2/1980 | Someshwar | .................. 711/219 |
| 4,349,895 | A | * | 9/1982 | Isogai | ...................... 365/230.06 |
| 4,369,504 | A | * | 1/1983 | Hanmura | ...................... 365/219 |
| 4,979,147 | A | * | 12/1990 | Ushiki | ...................... 365/189.04 |
| 5,263,029 | A | * | 11/1993 | Wicklund, Jr. | ......... G11C 29/56 365/201 |
| 5,394,369 | A | * | 2/1995 | Kagami | ....................... 365/200 |
| 5,708,612 | A | * | 1/1998 | Abe | .............................. 365/200 |
| 5,708,688 | A | * | 1/1998 | Ting | ...................... H03K 23/66 365/230.08 |

(Continued)

FOREIGN PATENT DOCUMENTS

KR 1020070063464 A 6/2007

OTHER PUBLICATIONS

RAM Guide: Part I DRAM and SRAM Basics, Jon "Hannibal" Stokes, Oct. 8, 2012, retrieved from https://web.archive.org/web/20121008162055/http://archive.arstechnica.com/paedia/r/ram_guide/ram_guide.part1-2.html on Dec. 30, 2014 (4 pages).*

(Continued)

*Primary Examiner* — Tuan Thai
*Assistant Examiner* — Daniel C Chappell
(74) *Attorney, Agent, or Firm* — William Park & Associates Ltd.

(57) ABSTRACT

A semiconductor apparatus includes a first memory die; a second memory die; and a processor configured to provide an external command, an external start address and an external end address which are associated with a read operation, to the first memory die, and provide an external command, an external start address and an external end address, which are associated with a write operation, to the second memory die, in the case where data stored in the first memory die is to be transferred to and stored in the second memory die.

10 Claims, 5 Drawing Sheets

(56) References Cited

U.S. PATENT DOCUMENTS

| | | | | |
|---|---|---|---|---|
| 5,787,045 | A * | 7/1998 | Lee | G11C 11/406 365/230.01 |
| 6,138,262 | A * | 10/2000 | Baek | 714/768 |
| 6,363,026 | B1 * | 3/2002 | Su et al. | 365/230.01 |
| 6,510,097 | B2 * | 1/2003 | Fukuyama | 365/230.03 |
| 6,639,854 | B2 * | 10/2003 | Hur et al. | 365/200 |
| 6,662,290 | B2 * | 12/2003 | Choi | G11C 8/18 365/230.01 |
| 6,731,560 | B2 * | 5/2004 | Kang et al. | 365/222 |
| 6,930,951 | B2 * | 8/2005 | Ahn et al. | 365/230.03 |
| 6,957,310 | B1 * | 10/2005 | Ikeda et al. | 711/157 |
| 7,017,027 | B2 * | 3/2006 | Inaba | G11C 8/04 365/222 |
| 7,068,558 | B2 * | 6/2006 | Cho | G11C 8/08 365/222 |
| 7,145,828 | B2 * | 12/2006 | Lee | G11C 11/406 365/222 |
| 7,164,613 | B2 * | 1/2007 | Fekih-Romdhane | G11C 8/04 365/201 |
| 7,283,415 | B2 * | 10/2007 | Byun | 365/222 |
| 7,340,664 | B2 * | 3/2008 | Shen | 714/755 |
| 7,558,152 | B2 * | 7/2009 | Lee | G11C 16/08 365/185.12 |
| 7,636,880 | B2 * | 12/2009 | Foss | 714/801 |
| 7,808,805 | B2 * | 10/2010 | Ko | G11C 7/1018 365/189.05 |
| 7,911,867 | B2 * | 3/2011 | Lee | G11C 11/406 365/222 |
| 7,911,875 | B2 * | 3/2011 | Shin | G11C 8/04 365/189.07 |
| 8,072,835 | B2 * | 12/2011 | Kim | 365/230.06 |
| 8,379,471 | B2 * | 2/2013 | Kwean | G11C 11/40622 365/193 |
| 8,391,100 | B2 * | 3/2013 | An | G11C 11/40611 365/222 |
| 8,488,404 | B2 * | 7/2013 | Hwang | G11C 8/04 365/191 |
| 8,854,917 | B2 * | 10/2014 | Kim | 365/236 |
| 8,872,686 | B2 * | 10/2014 | Chou et al. | 341/144 |
| 2002/0083262 | A1 * | 6/2002 | Fukuzumi | 711/103 |
| 2002/0110037 | A1 * | 8/2002 | Fukuyama | 365/230.03 |
| 2002/0114197 | A1 * | 8/2002 | Fukui et al. | 365/200 |
| 2005/0063238 | A1 * | 3/2005 | Nambu et al. | 365/222 |
| 2005/0105363 | A1 * | 5/2005 | Ko | 365/222 |
| 2007/0133281 | A1 * | 6/2007 | Fujita et al. | 365/185.05 |
| 2008/0192562 | A1 * | 8/2008 | Choi | 365/230.06 |
| 2008/0279021 | A1 * | 11/2008 | Han et al. | 365/201 |
| 2009/0003121 | A1 * | 1/2009 | Ko | 365/230.08 |
| 2009/0049455 | A1 * | 2/2009 | Ito et al. | 719/315 |
| 2009/0059691 | A1 * | 3/2009 | Chu et al. | 365/191 |
| 2009/0219775 | A1 * | 9/2009 | Hur | G11C 29/12 365/201 |
| 2010/0005376 | A1 * | 1/2010 | LaBerge et al. | 714/819 |
| 2010/0091602 | A1 * | 4/2010 | Shin | G11C 29/20 365/236 |
| 2010/0106919 | A1 * | 4/2010 | Manning | 711/154 |
| 2010/0238727 | A1 * | 9/2010 | Fujita et al. | 365/185.05 |
| 2011/0004805 | A1 * | 1/2011 | Seo | 714/763 |
| 2011/0007591 | A1 * | 1/2011 | Lee | 365/219 |
| 2011/0087849 | A1 * | 4/2011 | Yuan | 711/157 |
| 2012/0155200 | A1 * | 6/2012 | Moon et al. | 365/193 |
| 2013/0107649 | A1 * | 5/2013 | Cho | 365/201 |
| 2015/0162071 | A1 * | 6/2015 | Yoon | G11C 11/4085 365/203 |
| 2015/0179242 | A1 * | 6/2015 | Chi | G11C 8/04 365/222 |

OTHER PUBLICATIONS

Energy efficient address assignment through minimized memory row switching, Hettiaratchi et al, IEEE/ACM International Conference on Computer Aided Design, 2002 (ICCAD 2002), Nov. 10-14, 2002, pp. 577-581 (5 pages).*

Low-power memory mapping through reducing address bus activity, Panda et al, IEEE Transactions on Very Large Scale Integration (VLSI) Systems, vol. 7, iss. 3, Aug. 6, 2002, pp. 309-320 (12 pages).*

* cited by examiner dies 200 and 300.
ADDRESS COUNTING CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2012-0151737 filed on Dec. 24, 2012, in the Korean Intellectual Property Office, which is incorporated herein by reference in its entirety.

BACKGROUND

1. Technical Field

Various embodiments relate to a semiconductor integrated circuit, and more particularly to an address counting circuit and a semiconductor apparatus using the same.

2. Related Art

A semiconductor apparatus is configured to store data and output stored data. In order to increase the data storage capacity of a semiconductor apparatus, a stacked semiconductor apparatus in which two or more semiconductor memory dies for storing data are stacked upon one another may be used.

For example, where a data copying operation is performed in a semiconductor apparatus which has a plurality of semiconductor memory dies integrated vertically therein, that is, where the data stored in one memory die among the plurality of semiconductor memory dies is to be transferred to and stored in another memory die, when a large data copying operation is performed, a processor for controlling the plurality of semiconductor memory dies, according to a known art, consecutively input read commands and addresses to one memory die and consecutively input write commands and addresses to another memory die.

Therefore, power consumption may increase due to the commands and addresses consecutively inputted to the semiconductor apparatus in which the plurality of semiconductor memory dies are stacked when a large data copying operation is to be performed.

SUMMARY

In an embodiment of the present invention, a semiconductor apparatus includes: a first memory die; a second memory die; and a is processor configured to output an external command, an external start address and an external end address which are associated with a read operation, to the first memory die, and output an external command, an external start address and an external end address which are associated with a write operation, to the second memory die, in the case where data stored in the first memory die is to be stored in the second memory die.

In an embodiment of the present invention, a semiconductor apparatus includes: a command processing unit configured to decode an external command inputted from a processor and generate an internal command; an address buffer configured to buffer external address information inputted from the processor and output internal address information; an internal address generation block configured to count internal addresses in response to the internal command and the internal address information; and a memory die including a data storage unit which is configured to store data in a region designated by the internal address information or output data from a region designated by the internal address information, according to the internal command.

In an embodiment of the present invention, an address counting circuit includes: a counting control section configured to generate an enable signal, a column start address and a row start address in response to an internal command, internal address information, a first counting signal and a second counting signal; a column address counting section configured to generate the first is counting signal and a row address increase signal in response to the enable signal and the column start address; a row address counting section configured to generate the second counting signal in response to the row start address and the row address increase signal; a column address buffer configured to buffer the first counting signal and output a column-side counting address; and a row address buffer configured to buffer the second counting signal and output a row-side counting address.

BRIEF DESCRIPTION OF THE DRAWINGS

Features, aspects, and embodiments are described in conjunction with the attached drawings, in which.

DETAILED DESCRIPTION

Hereinafter, an address counting circuit and a semiconductor apparatus using the same according to the present invention will be described below with reference to the accompanying drawings through exemplary embodiments.

Figure 1:
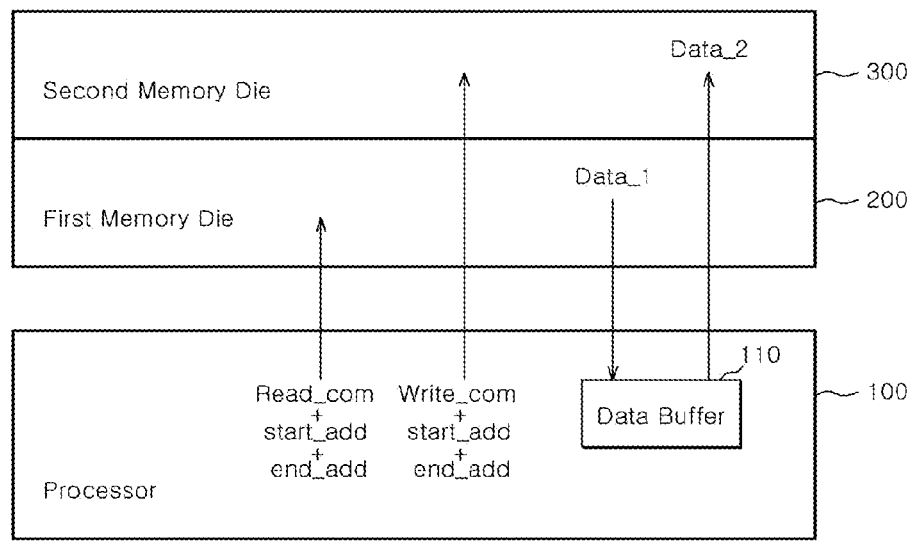
FIGS. 1 and 2 are diagrams explaining a semiconductor apparatus in accordance with an embodiment of the present invention.

Referring to FIG. 1, a semiconductor apparatus 1000 in accordance with an embodiment of the present invention includes a processor 100, a first memory die 200, and a second memory die 300.

The processor 100 is configured to control the first and second semiconductor memory dies 200 and 300 and electrically coupled to the first and second semiconductor memory dies 200 and 300.

The first memory die 200 is configured to receive an external command, an external address and data transmitted from the processor 100 and store received data. Also, the first memory die 200 may output stored data.

The second memory die 300 is configured to receive an external command, an external address and data inputted from the processor 100, store received data. Also, the second memory die 300 may output stored data.

FIG. 1 shows the case where, in the semiconductor apparatus in accordance with an embodiment of the present invention, the data stored in the first memory die 200 is to be stored in the second memory die 300.

Referring to FIG. 1, for example, the processor 100 inputs a read command Read_com as an external command, and an external is start address start_add and an external end address end_add as external addresses, to the first memory die 200. Also, the processor 100 inputs a write command Write_com as an external command, and an external start address start_add and an external end address end_add as external addresses, to the second memory die 300.

When the read command Read_com is inputted, the first memory die 200 outputs data Data_1 stored in addresses from the external start address start_add to the external end address end_add, to the processor 100.

When the write command Write_com is inputted, the second memory die 300 stores data Data_2 inputted from the processor 100, in a region from the external start address start_add to the external end address end_add.

The processor 100 includes a data buffer 110 which is configured to store the data Data_1 outputted from the first memory die 200 and output the data Data_2 to the second memory die 300. For example, the data Data_1 is the same data as the data Data_2.

Figure 2:
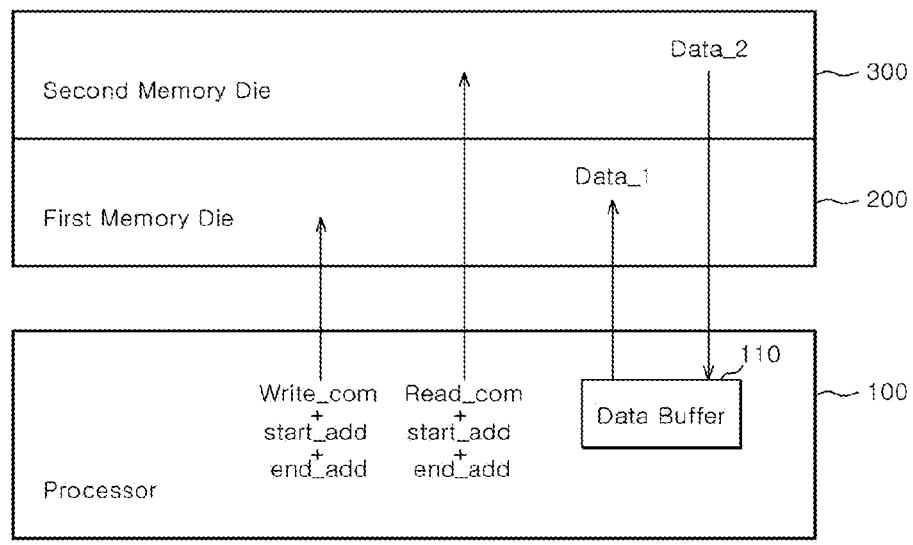

FIG. 2 shows the case where, in the semiconductor apparatus in accordance with an embodiment of the present invention, the data stored in the second memory die 300 is to be stored in the first memory die 200.

Referring to FIG. 2, for example, the processor 100 inputs a read command Read_com as an external command, and an external start address start_add and an external end address end_add as external addresses, to the second memory die 300. Also, the is processor 100 inputs a write command Write_com as an external command, and an external start address start_add and an external end address end_add as external addresses, to the first memory die 200.

When the read command Read_com is inputted, the second memory die 300 outputs data Data_2 stored in the address from the external start address start_add to the external end address end_add, to the processor 100.

When the write command Write_com is inputted, the first memory die 200 stores data Data_1 inputted from the data buffer 110 provided in the processor 100, in a region from the external start address start_add to the external end address end_add.

The first and second semiconductor memory dies 200 and 300 operating in these ways are configured in the same manner, and thus, the description of the configuration of the first memory die 200 will replace the description of the configuration of the second memory die 300.

Figure 3:
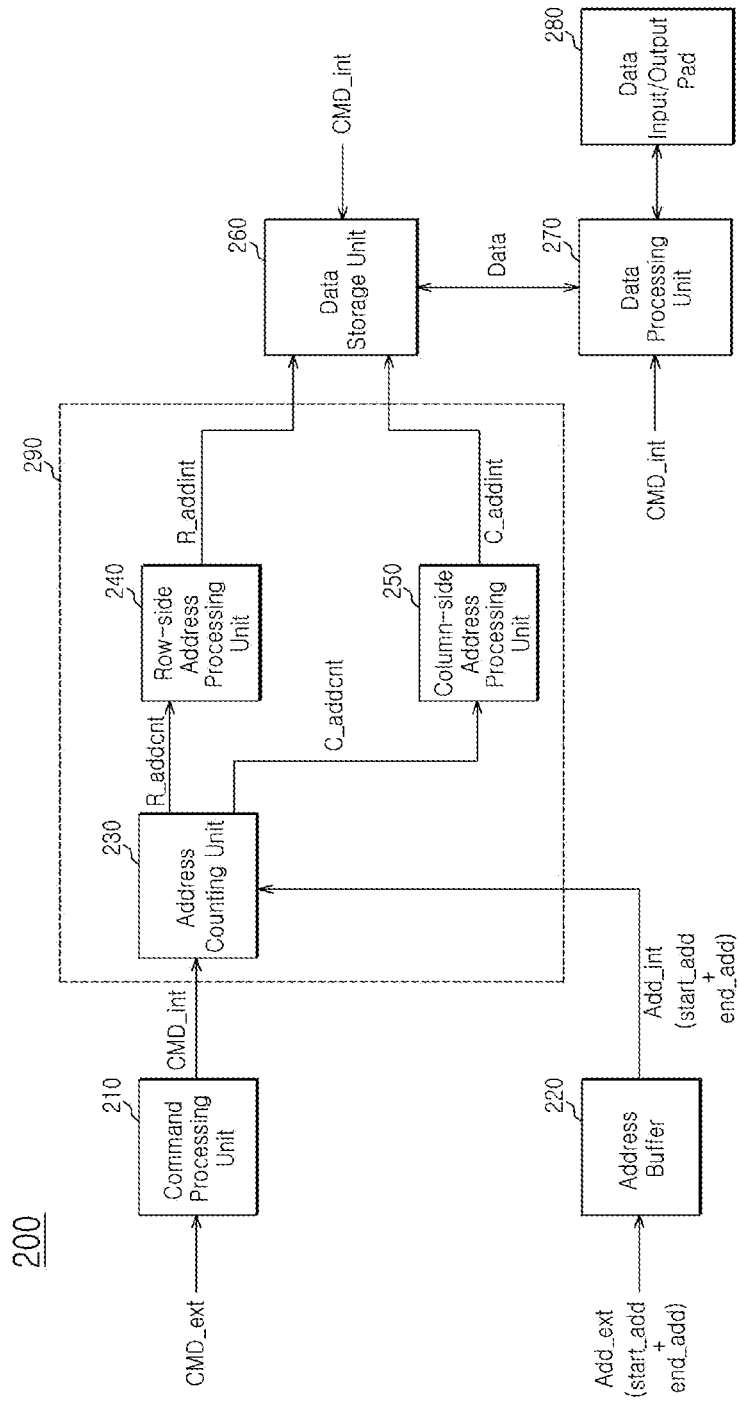
FIG. 3 is a configuration diagram of the first memory die of FIG. 1.

Referring to FIG. 3, the first memory die 200 includes a command processing unit 210, an address buffer 220, an address counting unit 230, a row-side address processing unit 240, a column-side address processing unit 250, a data storage unit 260, a data processing unit 270, and a data input/output pad 280. The address counting unit 230, the row-side address processing unit 240 and the column-side address processing unit 250 may constitute an internal address generation block 290.

The command processing unit 210 is configured to decode an external command CMD_ext inputted from the processor 100 and generate an internal command CMD_int.

The address buffer 220 is configured to buffer external address information Add_ext inputted from the processor 100 and output internal address information Add_int. The external address information Add_ext includes a start address start_add and an end address end_add of a region to and from which data is to be inputted and outputted. The internal address information Add_int generated by, for example, buffering such external address information Add_ext also includes a start address start_add and an end address end_add.

The internal address generation block 290 is configured to generate an internal address in response to the internal command CMD_int and the internal address information Add_int. The internal address may include a row-side internal address R_addint and a column-side internal address C_addint. For example, the internal address generation block 290 generates the internal addresses R_addint and C_addint by performing a counting operation in response to the internal command CMD_int. The internal address generation block 290 generates the internal addresses R_addint and C_addint, for example, by increasing the address by one from the value of the start address start_add to the value of the end address end_add.

In an embodiment of the present invention, the internal address generation block 290 includes the address counting unit 230, is the row-side address processing unit 240, and the column-side address processing unit 250.

The address counting unit 230 is configured to generate a row-side counting address R_addcnt and a column-side counting address C_addcnt by performing a counting operation in response to the internal address information Add_int when the internal command CMD_int is a write command or a read command. For example, if the internal command CMD_int is a write command or a read command, the address counting unit 230 sets the row-side counting address R_addcnt to a value corresponding to the value of the start address start_add and performing a count operation. In the counting operation, the address increases from the set row-side counting address R_addcnt and ends the counting operation when the row-side counting address R_addcnt has reached the value of the end address end_add. Also, if the internal command CMD_int is a write command or a read command, the address counting unit 230 sets the column-side counting address C_addcnt to a value corresponding to the value of the start address start_add and performing a count operation. In the counting operation, the address increases from the set column-side counting address C_addcnt and ends the counting operation when the column-side counting address C_addcnt has reached the value of the end address end_add.

The row-side address processing unit 240 is configured to generate the row-side internal address R_addint in response to the row-side counting address R_addcnt.

The column-side address processing unit 250 is configured to generate the column-side internal address C_addint in response to the column-side counting address C_addcnt.

The data storage unit 260 is configured to store data Data in a region which is designated by the internal address information Add_int or output data Data stored in the region which is designated by the internal address information Add_int, according to the internal command CMD_int.

The data processing unit 270 is configured to output the data inputted from the data input/output pad 280, to the data storage unit 260 in response to the internal command CMD_int, or output the data Data outputted from the data storage unit 260, to the data input/output pad 280 in response to the internal command CMD_int.

The data input/output pad 280 is coupled to the data buffer 110 which is provided in the processor 100 shown in FIG. 1.

Figure 4:
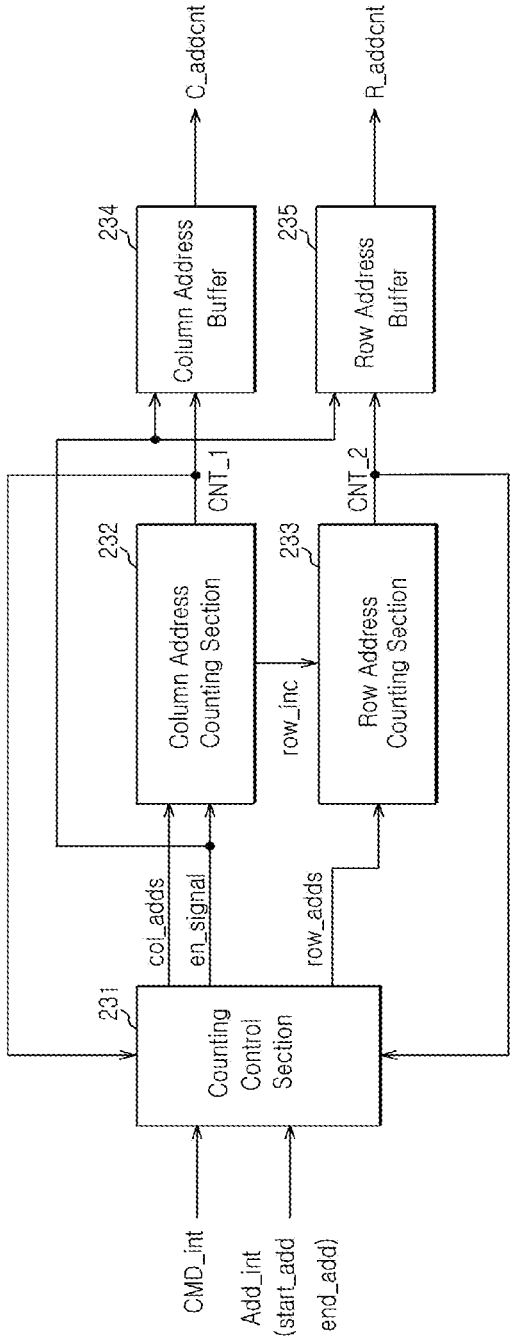
FIG. 4 is a configuration diagram of the address counting unit of FIG. 3.

Referring to FIG. 4, the address counting unit 230 includes a counting control section 231, a column address counting section 232, a row address counting section 233, a column address buffer 234, and a row address buffer 235.

The counting control section 231 is configured to generate an enable signal en_signal, a column start address col_adds and a row start address row_adds in response to the internal command CMD_int, the internal address information Add_int, a first counting signal CNT_1 and a second counting signal CNT_2. As described above, the internal command CMD_int includes the start address start_add and the end address end_add. For example, when the internal command CMD_int is a read command or a write command, the counting control section 231 enables the enable signal en_signal, outputs the row start address row_adds and the column start address col_adds in response to the start address start_add, and disables the enable signal en_signal by comparing the end address end_add with the first and second counting signals CNT_1 and CNT_2. For example, the counting control section 231 disables the enable signal en_signal when the end address end_add is identical to the first and second counting signals CNT_1 and CNT_2.

The column address counting section 232 is configured to generate the first counting signal CNT_1 and a row address increase signal row_inc in response to the enable signal en_signal and the column start address col_adds. For example, the column address counting section 232 sets the first counting signal CNT_1 to the same value as the column start address col_adds when the enable signal en_signal is enabled, increases the set first counting signal CNT_1 by performing a counting operation, and enables the row address increase signal row_inc for a preset time in the case where the first counting signal CNT_1 reaches a maximum value and then becomes a minimum value. Describing this in detail through an example, the first counting signal CNT_1 is set to (0, 0, 1, 1) by the column start address col_adds, and is increased from the set value by performing a counting operation. If the first counting signal CNT_1 reaches the is maximum value of (1, 1, 1, 1) and then becomes the minimum value of (0, 0, 0, 0), the row address increase signal row_inc is enabled for the preset time and is then disabled.

The row address counting section 233 is configured to generate the second counting signal CNT_2 in response to the row start address row_adds and the row address increase signal row_inc. For example, the row address counting section 233 sets the second counting signal CNT_2 to the same value as the row start address row_adds, and increases the counting value of the set second counting signal CNT_2 each time the row address increase signal row_inc is enabled. Describing this in detail through an example, the second counting signal CNT_2 is set to (0, 0, 1, 0) by the row start address row_adds, and is increased consecutively to counting values of (0, 0, 1, 1), (0, 1, 0, 0), (0, 1, 0, 1), (0, 1, 1, 0), (0, 1, 1, 1), . . . each time the row address increase signal row_inc is enabled.

The column address buffer 234 is configured to buffer the first counting signal CNT_1 when the enable signal en_signal is enabled and output the column-side counting address C_addcnt.

The row address buffer 235 is configured to buffer the second counting signal CNT_2 when the enable signal en_signal is enabled and output the row-side counting address R_addcnt.

Figure 5:
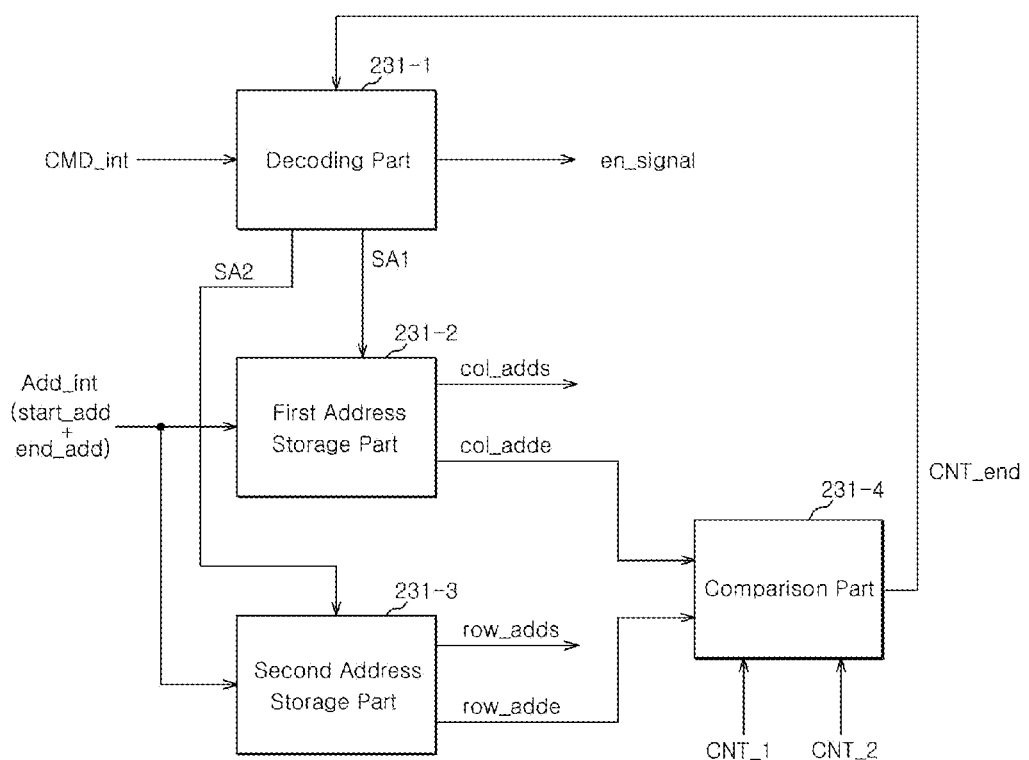
FIG. 5 is a configuration diagram of the counting control section of FIG. 4.

Referring to FIG. 5, the counting control section 231 includes a decoding part 231-1, a first address storage part 231-2, a second address storage part 231-3, and a comparison part 231-4.

The decoding part 231-1 is configured to decode the internal is command CMD_int, enable the enable signal en_signal when the internal command CMD_int is a read command or a write command, and generates first and second storage enable signals SA1 and SA2. Also, the decoding part 231-1 disables the enable signal en_signal when a counting end signal CNT_end is enabled.

The first address storage part 231-2 is configured to store the start address start_add and the end address end_add when the first storage enable signal SA1 is enabled, and output the stored start address start_add and end address end_add as the column start address col_adds and a column end address col_adde.

The second address storage part 231-3 is configured to output the start address start_add and the end address end_add as the row start address row_adds and a row end address row_adde when the second storage enable signal SA2 is enabled.

The comparison part 231-4 is configured to enable the counting end signal CNT_end when the first counting signal CNT_1 and the column end address col_adde are the same with each other and the second counting signal CNT_2 and the row end address row_adde are the same with each other.

Operations of one memory die provided in the semiconductor apparatus 1000 in accordance with an embodiment of the present invention, configured as mentioned above, will be described below.

Referring to FIG. 3, the first memory die 200 includes the command processing unit 210, the address buffer 220, the address is counting unit 230, the row-side address processing unit 240, the column-side address processing unit 250, the data storage unit 260, the data processing unit 270, and the data input/output pad 280.

The command processing unit 210 decodes the external command CMD_ext inputted from the processor 100 and generates the internal command CMD_int.

The address buffer 220 buffers the external address information Add_ext and outputs the internal address information Add_int. Each of the external address information Add_ext and the internal address information Add_int includes the start address start_add and the end address end_add.

Figure 6:
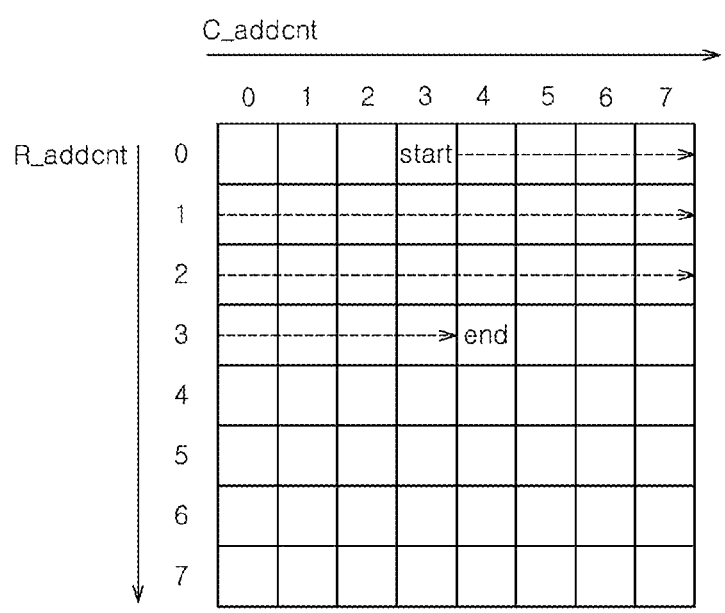
FIG. 6 is a diagram explaining the semiconductor apparatus in accordance with an embodiment of the present invention.

The address counting unit 230 generates the row-side counting address R_addcnt and the column-side counting address C_addcnt by performing a counting operation to increase the internal command CMD_int from the start address start_add to the end address end_add when the internal command CMD_int is a read or write command. In detail, referring to FIGS. 4 to 6, in the case where the internal command CMD_int is a read or write command, the column-side counting address C_addcnt and the row-side counting address R_addcnt corresponding to the start address start_add are set. The column-side counting address C_addcnt and the row-side counting address R_addcnt with set values are increased up to the end address end_add by performing a counting operation. For example, referring to FIG. 6, the start address start_add of the column-side counting address C_addcnt is the decimal number of 3, and the end address end_add of the column-side counting address C_addcnt is the decimal number of 4. Also, the start address start_add of the row-side counting address R_addcnt is the decimal number of 0, and the end address end_add of the row-side counting address R_addcnt is the decimal number of 3. The column-side counting address C_addcnt is increased from 3 to 7 by performing a counting operation, and, then, when becoming 0 (a minimum value) from 7 (a maximum value), the row-side counting address R_addcnt is increased to 1 from 0 by performing a counting operation. In this way, the column-side counting address C_addcnt and the row-side counting address R_addcnt are generated. When the row-side counting address R_addcnt becomes 3 and the column-side counting address C_addcnt becomes 4, counting operation of the column-side counting address C_addcnt and the row-side counting address R_addcnt is ended.

Referring back to FIG. 3, the row-side address processing unit 240 outputs the row-side counting address R_addcnt as the row-side internal address R_addint.

The column-side address processing unit 250 outputs the column-side counting address C_addcnt as the column-side internal address C_addint.

The data storage unit 260 stores the data Data inputted from the data processing unit 270, in a region corresponding to the row-side internal address R_addint and the column-side internal address C_addint when the internal command CMD_int is a write command. Further, the data storage unit 260 outputs the data Data stored in a region corresponding to the row-side internal address R_addint and the column-side internal address C_addint, to the data processing unit 270 when the internal command CMD_int is a read command.

The data processing unit 270 outputs the data Data outputted from the data storage unit 260, through the data input/output pad 280 to the data buffer 110 provided in the processor 100 when the internal command CMD_int is a read command. Further, the data processing unit 270 outputs the data Data outputted from the data buffer 110 and inputted through the data input/output pad 280, to the data storage unit 260 when the internal command CMD_int is a write command.

In this way, a memory die (for example, the first memory die 200) which is provided in the semiconductor apparatus 1000 in accordance with an embodiment of the present invention may input data to a position corresponding to addresses from a start address to an end address when a read or write command is inputted and the start address and the end address are inputted, and may output the data stored in the corresponding position.

Therefore, it is not necessary for a processor to consecutively input a read or write command to a memory die to output or input large data, and also, it is not necessary for the processor to consecutively input addresses. Accordingly, power consumption may be reduced when inputting and outputting large is capacity data.

As is apparent from the above descriptions, a semiconductor apparatus which has a plurality of semiconductor memory dies stacked upon one another may include a processor for controlling the semiconductor memory dies. For example, where large data is copied from one memory die to another memory die, by inputting a read command, a start address and an end address to one memory die and by inputting a write command, a start address and an end address to another memory die, it is not necessary for the processor to consecutively input the read command, the write command and the addresses to the semiconductor memory dies which perform data copy. As a consequence, in the semiconductor apparatus in accordance with an embodiment of the present invention in which the plurality of semiconductor memory dies share one processor, power consumption may be reduced in the case of performing a large data copying operation when compared to a known semiconductor apparatus.

While certain embodiments have been described above, it will be understood to those skilled in the art that the embodiments described are by way of example only. Accordingly, the address counting circuit and the semiconductor apparatus using the same described herein should not be limited based on the described embodiments. Rather, the address counting circuit and the semiconductor apparatus using the same described herein should only be limited in light of the claims that follow when taken in is conjunction with the above description and accompanying drawings.

What is claimed is:

1. A semiconductor apparatus comprising:
   a command processing unit decoding an external command inputted from a processor and generating an internal command;
   an address buffer buffering external address information inputted from the processor and outputting internal address information;
   an internal address generation block receiving the internal address information directly from the address buffer without any intermediaries and generating internal addresses by performing a counting operation in response to the internal command and the internal address information; and
   a data storage unit storing data in a region designated by the internal address information or outputting data from a region designated by the internal address information in response to the internal command;
   wherein the internal address generation block performs the counting operation in response to the internal command and the internal address information and stops the counting operation by comparing the internal addresses with the internal address information.

2. The semiconductor apparatus according to claim 1, wherein each of the external address information and the internal address information comprises a start address and an end address of a region to and from which data is to be inputted and outputted.

3. The semiconductor apparatus according to claim 2, wherein the internal address generation block generates the internal addresses by performing a counting operation in response to the internal command, and the internal addresses are generated performing a counting operation from a value of the start address to a value of the end address.

4. The semiconductor apparatus according to claim 3,
   wherein the internal addresses comprise a row-side internal address and a column-side internal address, and
   wherein the internal address generation block comprises:
   an address counting unit generating a row-side counting address and a column-side counting address by performing a counting operation in response to the internal address information when the internal command is a read command or a write command;
   a row-side address processing unit generating the row-side internal address in response to the row-side counting address; and
   a column-side address processing unit generating the column-side internal address in response to the column-side counting address.

5. The semiconductor apparatus according to claim 4, wherein the address counting unit generates the column-side counting address by performing a counting operation in response to the internal address information, and generates the row-side counting address by performing a counting operation each time the column-side counting address reaches a maximum value and then becomes a minimum value.

6. An address counting circuit comprising:
   a counting control section generating an enable signal, a column start address and a row start address in response to an internal command, internal address information, a first counting signal received from a column address counting section and a second counting signal received from a row address counting section;
   the column address counting section performing a counting operation when the enable signal from the counting control section is enabled, generating the first counting signal by performing a counting operation, sending the first counting signal to the counting control section and a column address buffer, generating a row address increase signal in response to the column start address received from the counting control section when the enable signal received from the counting control section is enabled, and stopping the counting operation when the enable signal from the counting control section is disabled;
   the row address counting section generating the second counting signal in response to receiving the row start address and the row address increase signal from the counting control section, and outputting the second counting signal to the counting control section and a row address buffer;

the column address buffer buffering the first counting signal and outputting a column-side counting address; and the row address buffer buffering the second counting signal and outputting a row-side counting address;

wherein the internal address information comprises a start address and an end address, and wherein the counting control section enables the enable signal when the internal command is a read command or a write command, disables the enable signal by comparing the end address and the first and second counting signals, and outputs the row start address to the row address counting section and the column start address to the column address counting section in response to the start address.

7. The address counting circuit according to claim 6, wherein the counting control section disables the enable signal when the end address is identical to the first and second counting signals.

8. The address counting circuit according to claim 6, wherein the counting control section comprises:

a decoding part decoding the internal command, enabling the enable signal when the internal command is a read command or a write command, generating first and second storage enable signals, and disabling the enable signal when a counting end signal is enabled;

a first address storage part storing the start address and the end address when the first storage enable signal is enabled, and outputting the stored start address and end address as the column start address and the column end address;

a second address storage part storing the start address and the end address when the second storage enable signal is enabled, and outputting the stored start address and end address as the row start address and the row end address; and a comparison part enabling the counting end signal when the first counting signal and the column end address are the same with each other and the second counting signal and the row end address are the same with each other.

9. The address counting circuit according to claim 6, wherein the column address counting section sets the first counting signal to the same value as the column start address when the enable signal is enabled, generates the set first counting signal by performing a counting operation, and enables the row address increase signal in the case where the first counting signal reaches a maximum value and then becomes a minimum value.

10. The address counting circuit according to claim 9, wherein the row address counting section sets the second counting signal to the same value as the row start address, and increases a counting value of the set second counting signal each time the row address increase signal is enabled.

* * * * *